US010867953B2

(12) United States Patent
Ang et al.

(10) Patent No.: US 10,867,953 B2
(45) Date of Patent: Dec. 15, 2020

(54) MANUFACTURING METHOD OF INTEGRATED FAN-OUT PACKAGE

(71) Applicant: Taiwan Semiconductor Manufacturing Co., Ltd., Hsinchu (TW)

(72) Inventors: Ai-Tee Ang, Hsinchu (TW); Shing-Chao Chen, Hsinchu County (TW); Ching-Hua Hsieh, Hsinchu (TW); Chih-Wei Lin, Hsinchu County (TW); Ching-Yao Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/396,782

(22) Filed: Apr. 29, 2019

(65) Prior Publication Data

US 2019/0252339 A1    Aug. 15, 2019

Related U.S. Application Data

(62) Division of application No. 15/715,132, filed on Sep. 25, 2017, now Pat. No. 10,276,537.

(51) Int. Cl.
*H01L 23/00* (2006.01)
*H01L 21/683* (2006.01)
*H01L 21/56* (2006.01)

(52) U.S. Cl.
CPC ............ *H01L 24/19* (2013.01); *H01L 21/561* (2013.01); *H01L 21/568* (2013.01);
(Continued)

(58) Field of Classification Search
CPC .......... H01L 24/19; H01L 24/96; H01L 24/25; H01L 21/561; H01L 21/568; H01L 24/11;
(Continued)

(56) References Cited

U.S. PATENT DOCUMENTS

| 8,597,979 B1 * | 12/2013 | Burgyan | ............. H01L 23/3121 257/686 |
| 9,000,584 B2 | 4/2015 | Lin et al. | |

(Continued)

*Primary Examiner* — Marcos D. Pizarro
*Assistant Examiner* — Sue Tang
(74) *Attorney, Agent, or Firm* — JCIPRNET

(57) ABSTRACT

A manufacturing method of integrated fan-out package includes following steps. First and second dies are provided on adhesive layer formed on carrier. Heights of first and second dies are different. First and second dies respectively has first and second conductive posts each having substantially a same height. The dies are pressed against adhesive layer to make active surfaces thereof be in direct contact with adhesive layer and conductive posts thereof be submerged into adhesive layer. Adhesive layer is cured. Encapsulant is formed to encapsulate the dies. Carrier is removed from adhesive layer. Heights of first and second conductive posts are reduced and portions of the adhesive layer is removed. First and second conductive posts are laterally wrapped by and exposed from adhesive layer. Top surfaces of first and second conductive posts are leveled. Redistribution structure is formed over adhesive layer and is electrically connected to first and second conductive posts.

20 Claims, 20 Drawing Sheets

(52) U.S. Cl.
CPC .......... *H01L 21/6836* (2013.01); *H01L 24/11* (2013.01); *H01L 24/24* (2013.01); *H01L 24/25* (2013.01); *H01L 24/96* (2013.01); *H01L 24/20* (2013.01); *H01L 2221/68331* (2013.01); *H01L 2221/68359* (2013.01); *H01L 2221/68368* (2013.01); *H01L 2224/1184* (2013.01); *H01L 2224/1191* (2013.01); *H01L 2224/11845* (2013.01); *H01L 2224/18* (2013.01); *H01L 2224/24101* (2013.01); *H01L 2224/24137* (2013.01); *H01L 2224/25171* (2013.01); *H01L 2224/73209* (2013.01); *H01L 2224/95001* (2013.01); *H01L 2224/96* (2013.01)

(58) Field of Classification Search
CPC ..... H01L 21/6836; H01L 24/24; H01L 24/20; H01L 2224/18; H01L 2224/96; H01L 2221/68368; H01L 2221/68359; H01L 2221/68331; H01L 2224/95001; 2224/24137; H01L 2224/24101; H01L 2224/1191; H01L 2224/11845; H01L 2224/1184; H01L 2224/73209; H01L 2224/25171; H01L 2224/12105; H01L 2924/18162; H01L 2224/141; H01L 25/18; H01L 25/16; H01L 24/14; H01L 23/3107

See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2009/0223705 A1* | 9/2009 | Yamashita | H01L 24/29 174/260 |
| 2010/0224992 A1* | 9/2010 | McConnelee | H01L 23/5389 257/723 |
| 2017/0243845 A1* | 8/2017 | Lee | H01L 21/31051 |
| 2018/0005987 A1* | 1/2018 | Hiner | A61B 3/0025 |
| 2018/0158779 A1* | 6/2018 | Yang | H01L 23/5389 |

* cited by examiner

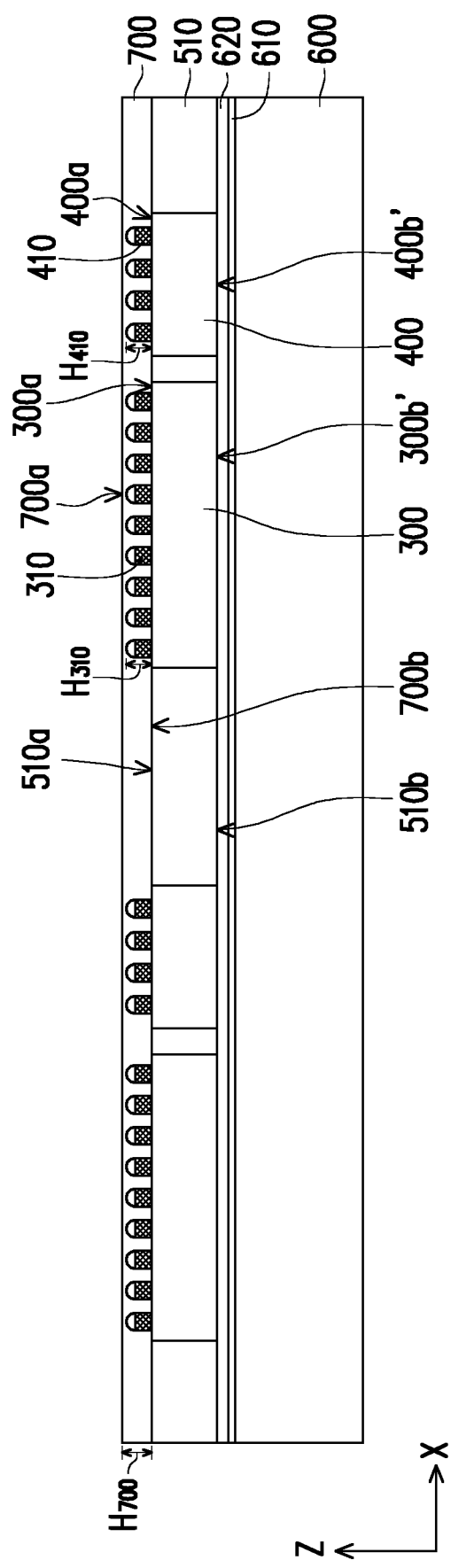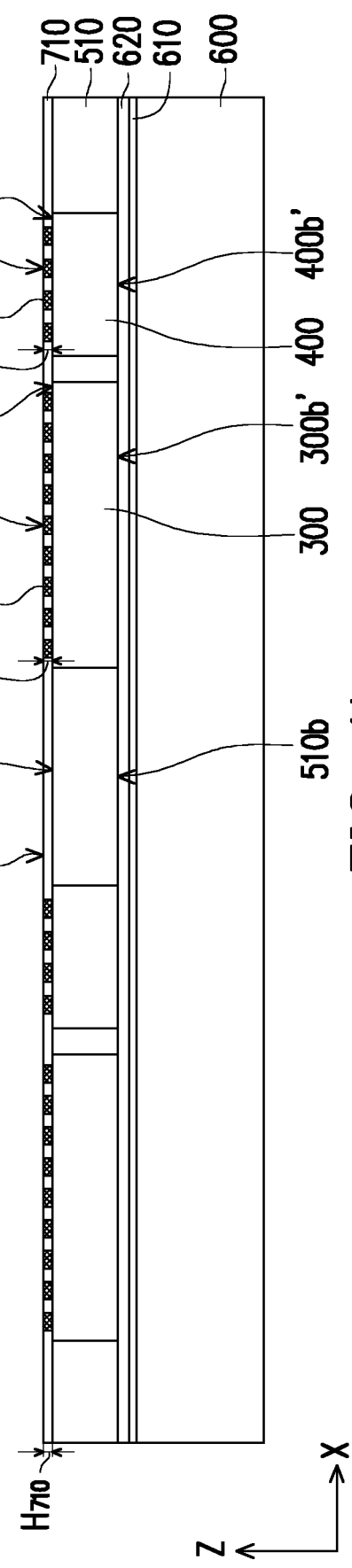

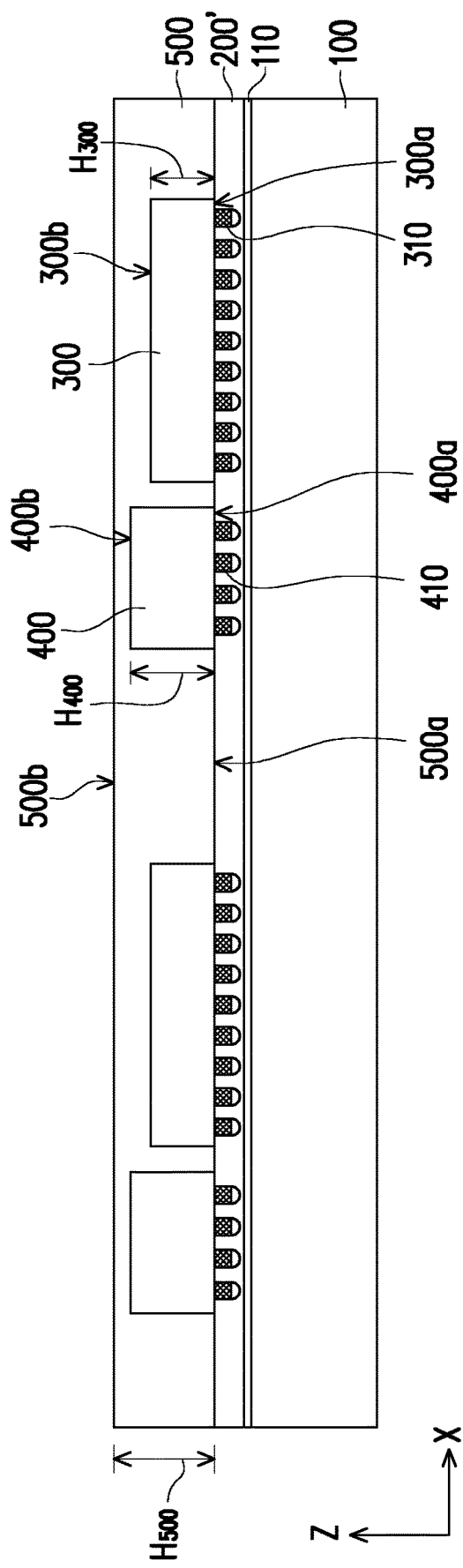
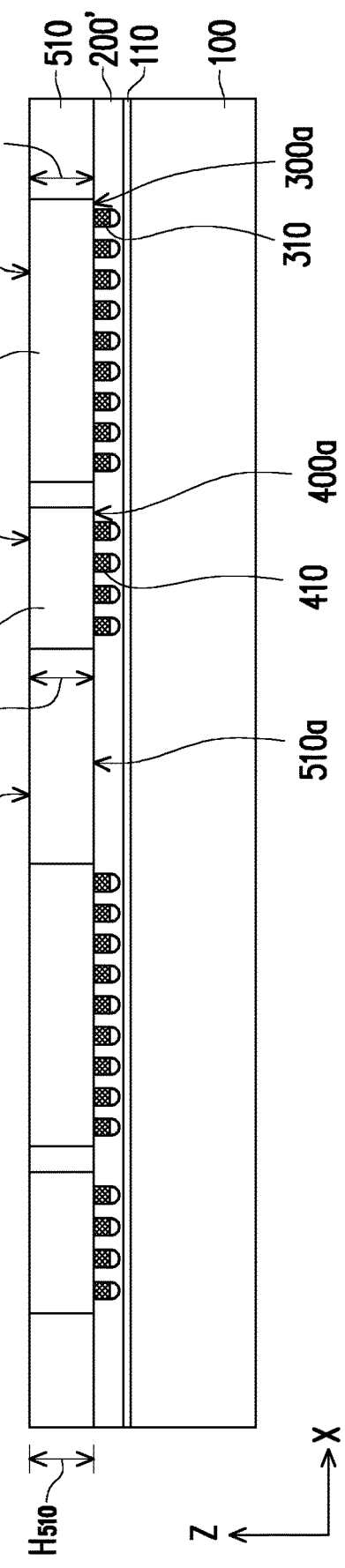
FIG. 2D
FIG. 2E

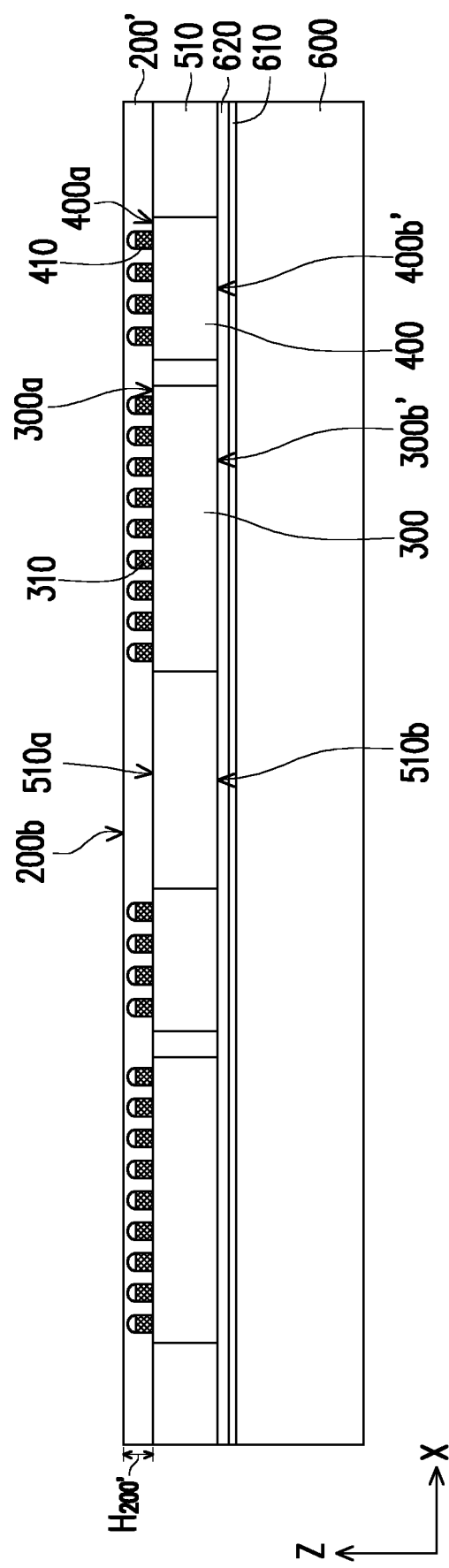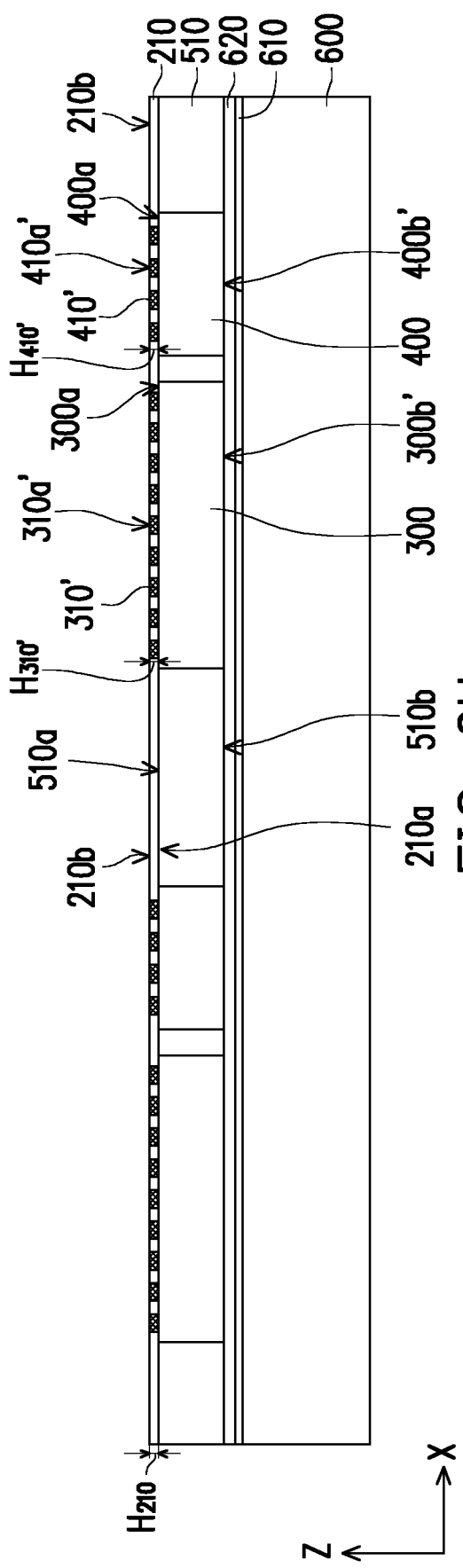

MANUFACTURING METHOD OF INTEGRATED FAN-OUT PACKAGE

CROSS-REFERENCE TO RELATED APPLICATION

This application is a divisional application of and claims the priority benefit of a prior application Ser. No. 15/715,132, filed on Sep. 25, 2017. The entirety of each of the above-mentioned patent applications is hereby incorporated by reference herein and made a part of this specification.

BACKGROUND

In recent years, the semiconductor industry has experienced rapid growth due to continuous improvement in integration density of various electronic components, e.g. transistors, diodes, resistors, capacitors, etc. For the most part, this improvement in integration density has come from successive reductions in minimum feature size, which allows more components to be integrated into a given area. Currently, integrated fan-out packages are becoming increasingly popular for their compactness. In the integrated fan-out packages, planarization of the molding compound and formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2M are schematic cross-sectional views illustrating various stages of a method for manufacturing an integrated fan-out package in accordance with some alternative embodiments of the disclosure.

DETAILED DESCRIPTION

Figure 1A:
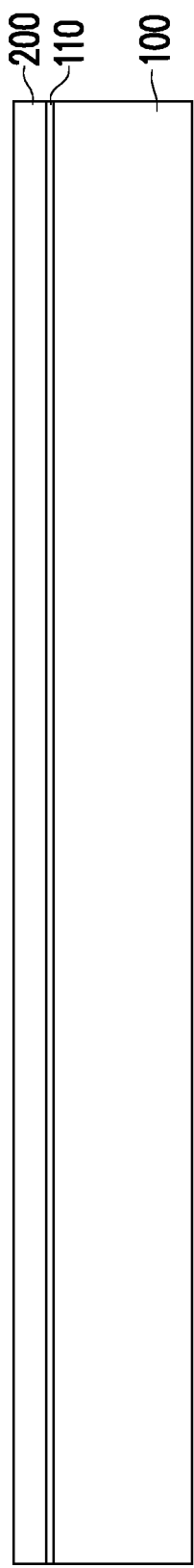
FIGS. 1A-1N are schematic cross-sectional views illustrating various stages of a method for manufacturing an integrated fan-out package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
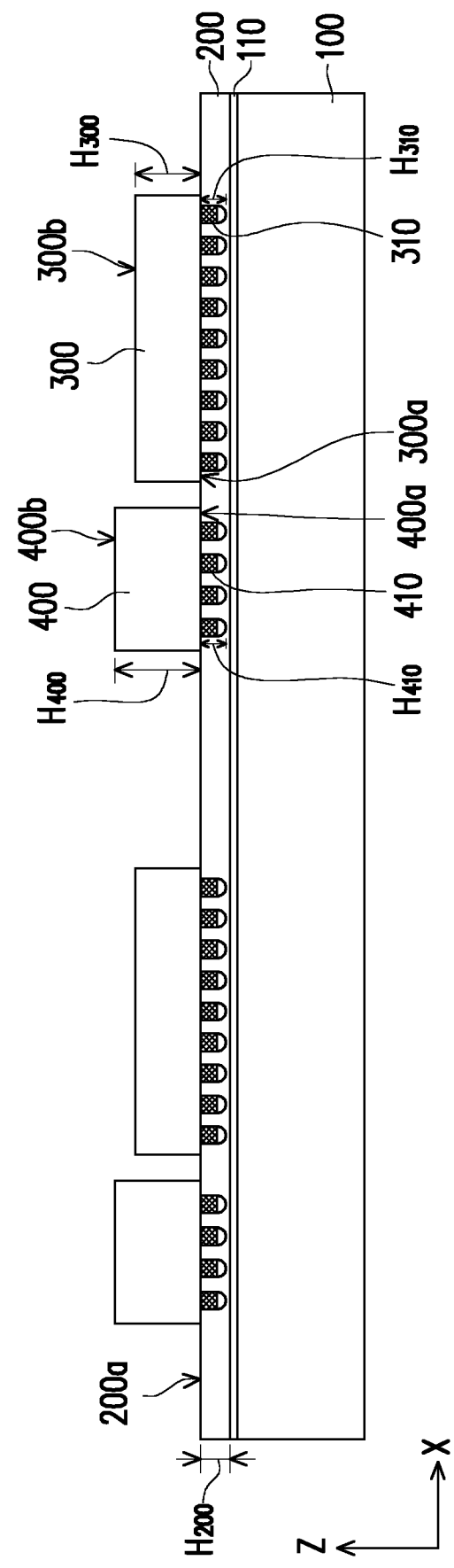
Figure 1C:
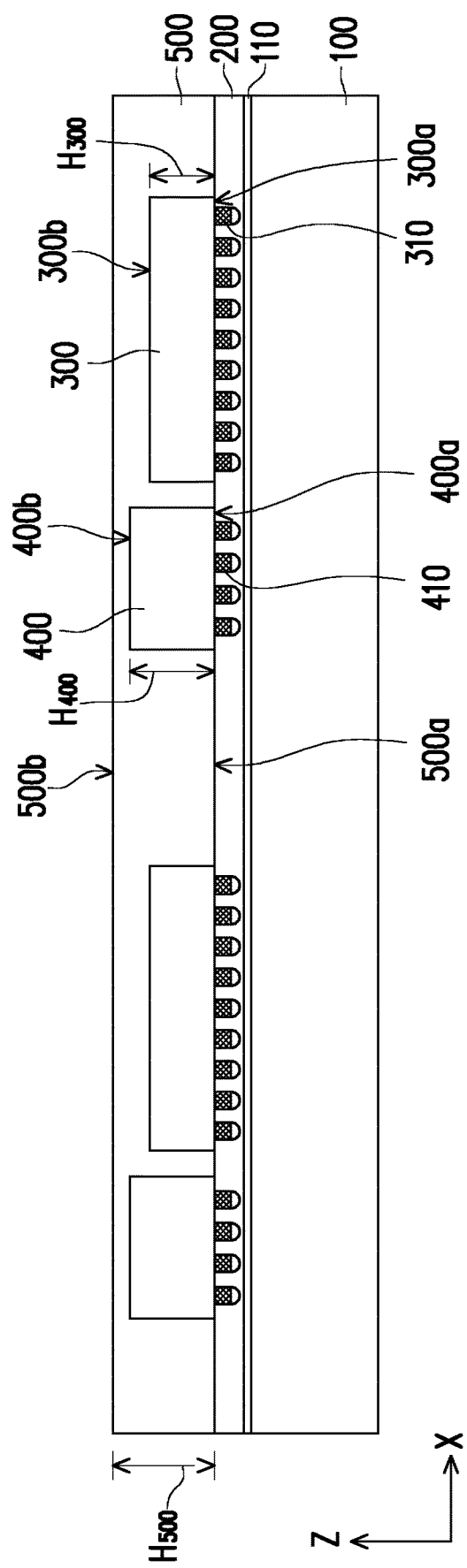
Figure 1D:
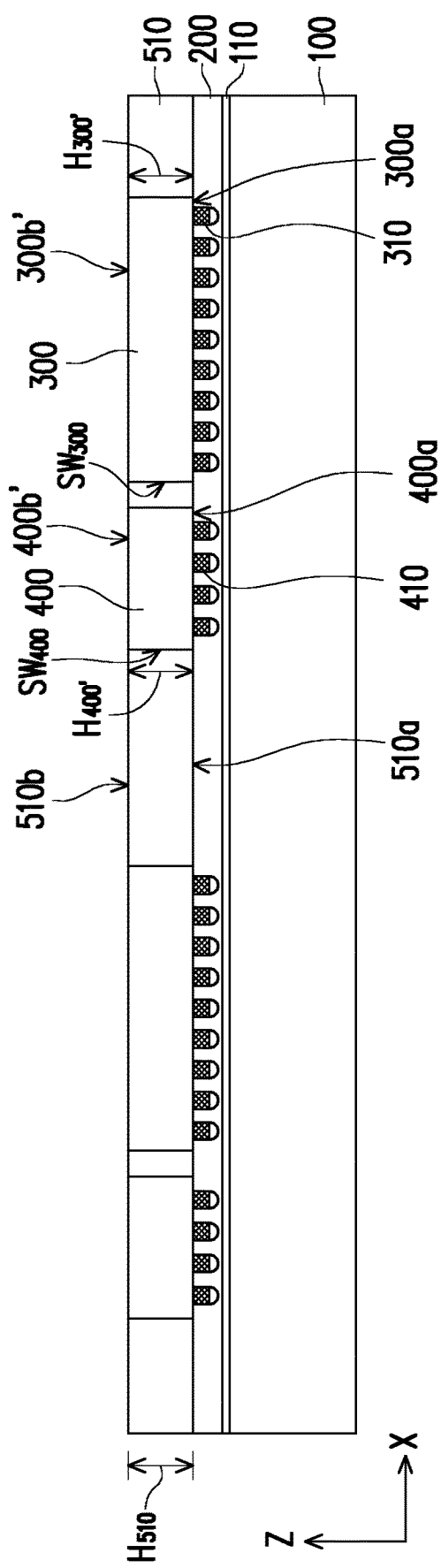
Figure 1E:
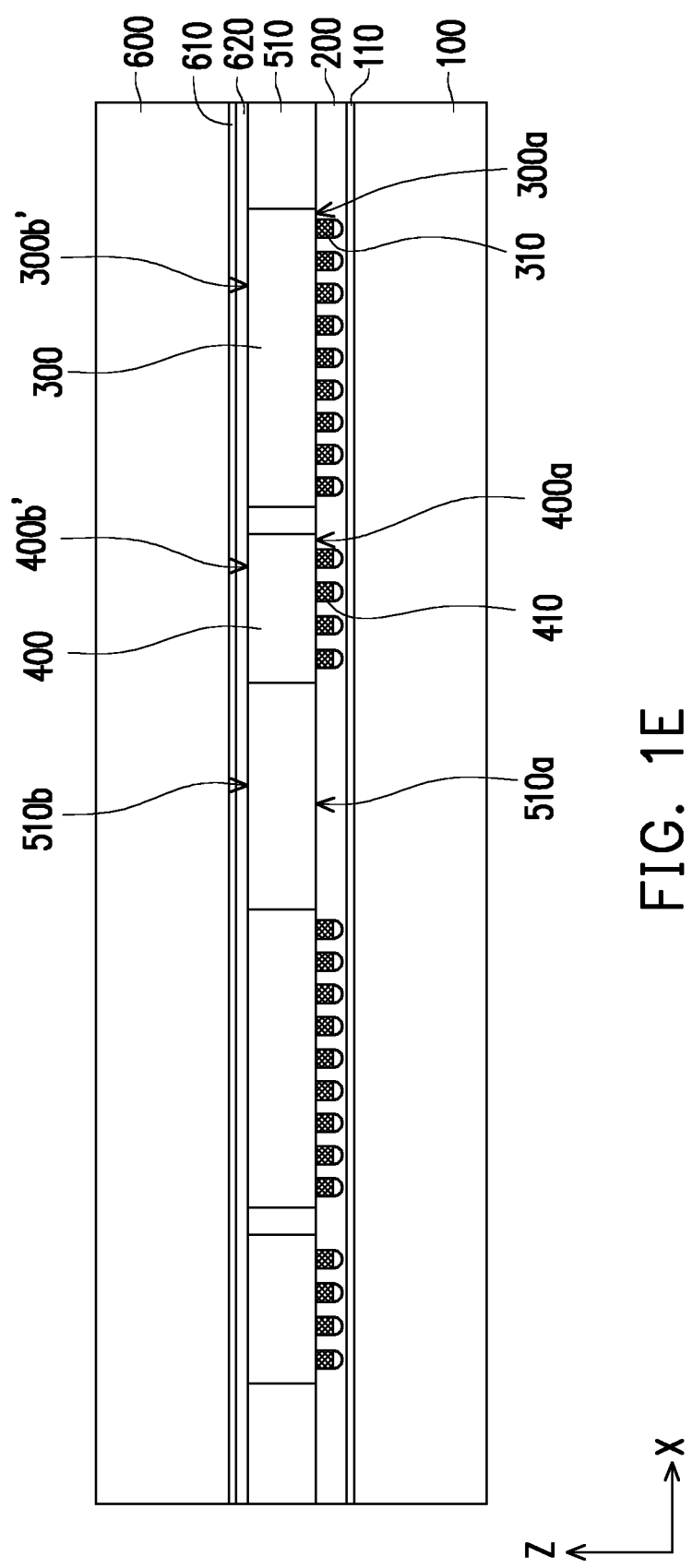
Figure 1F:
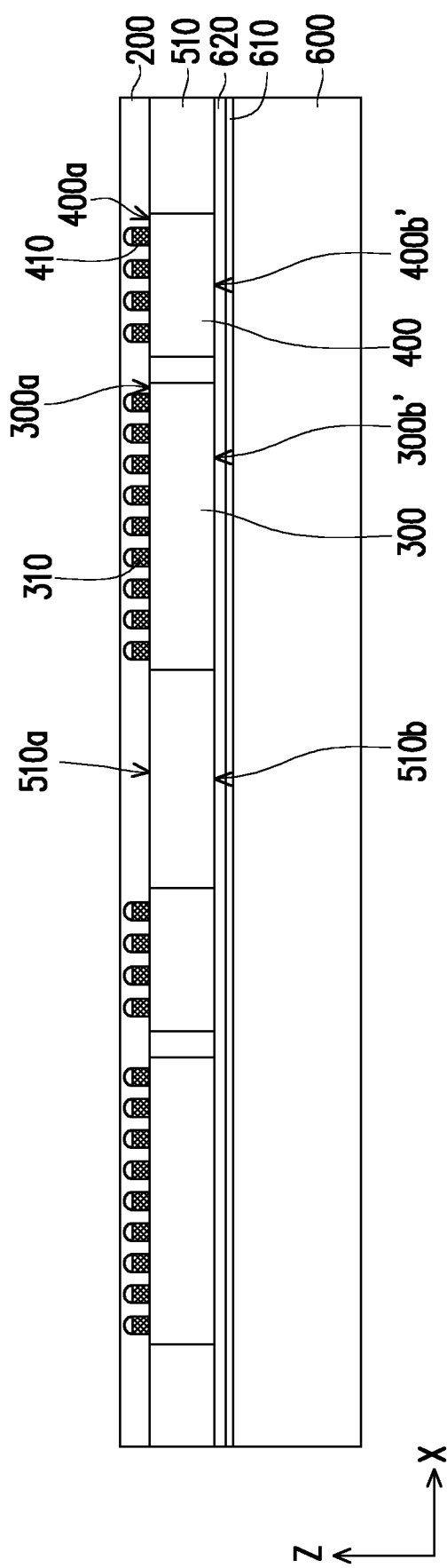
Figure 1G:
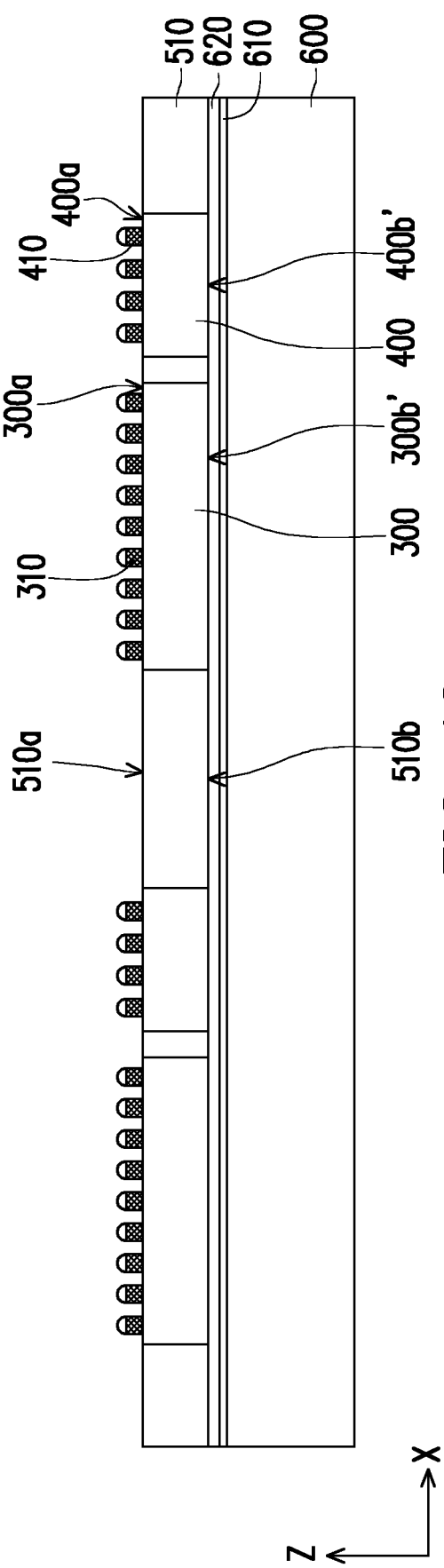
Figure 1J:
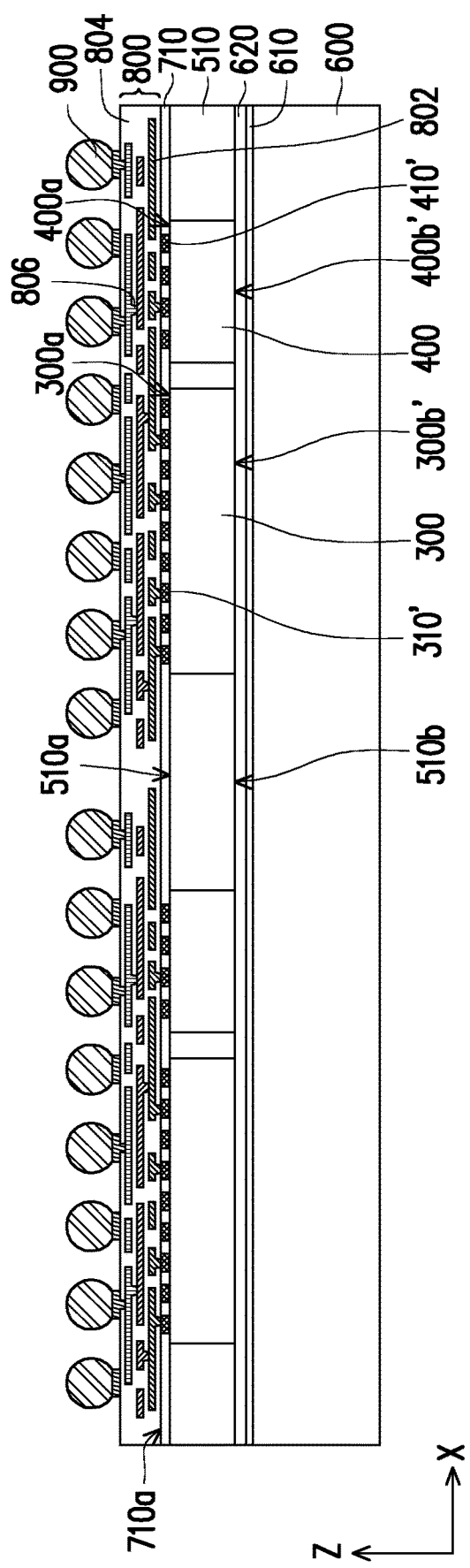
Figure 1K:
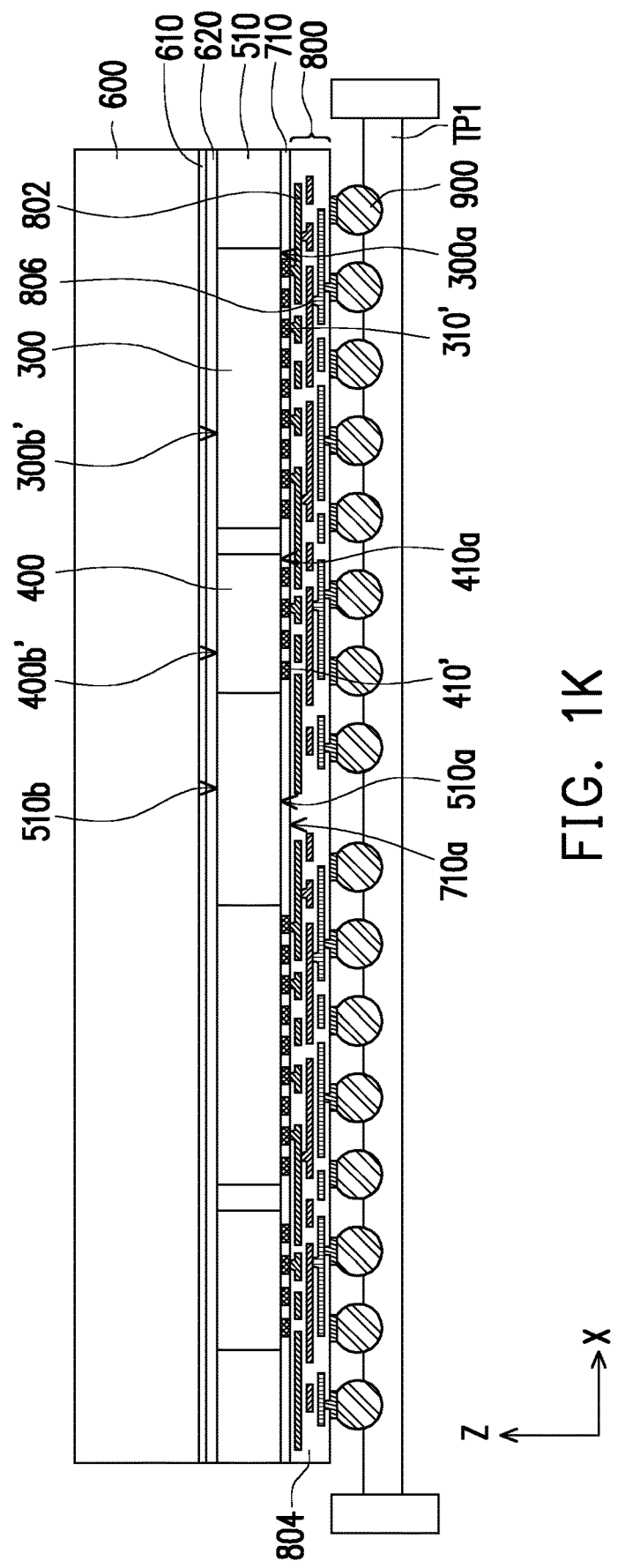
Figure 1L:
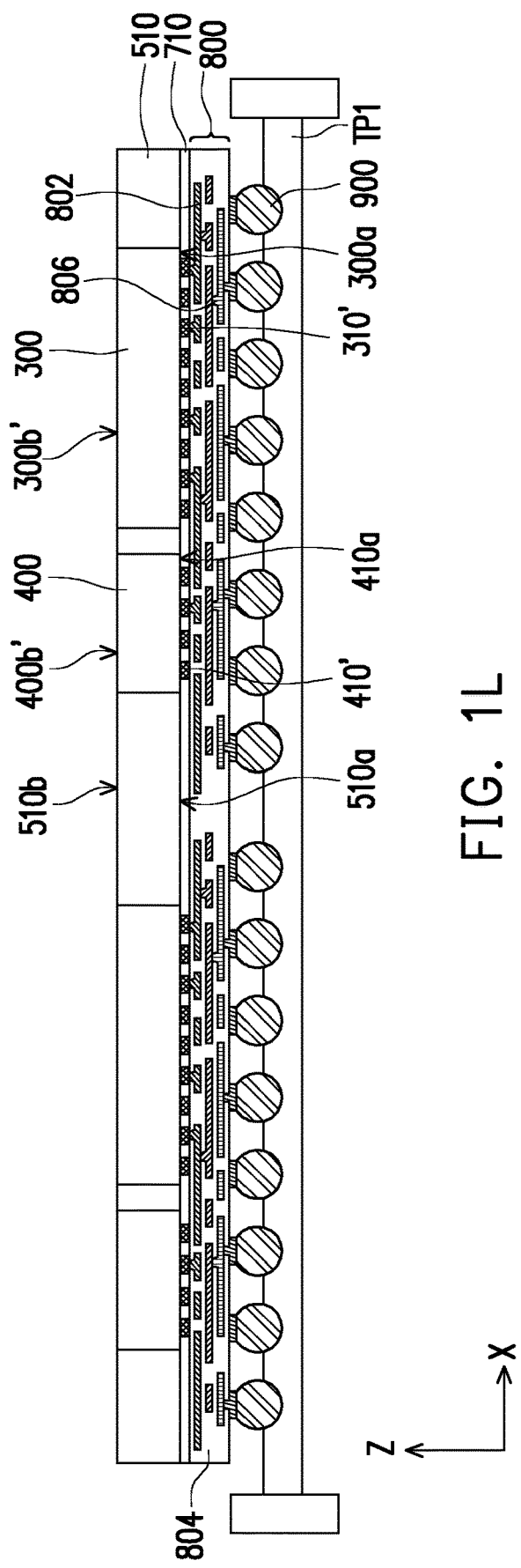
Figure 1M:
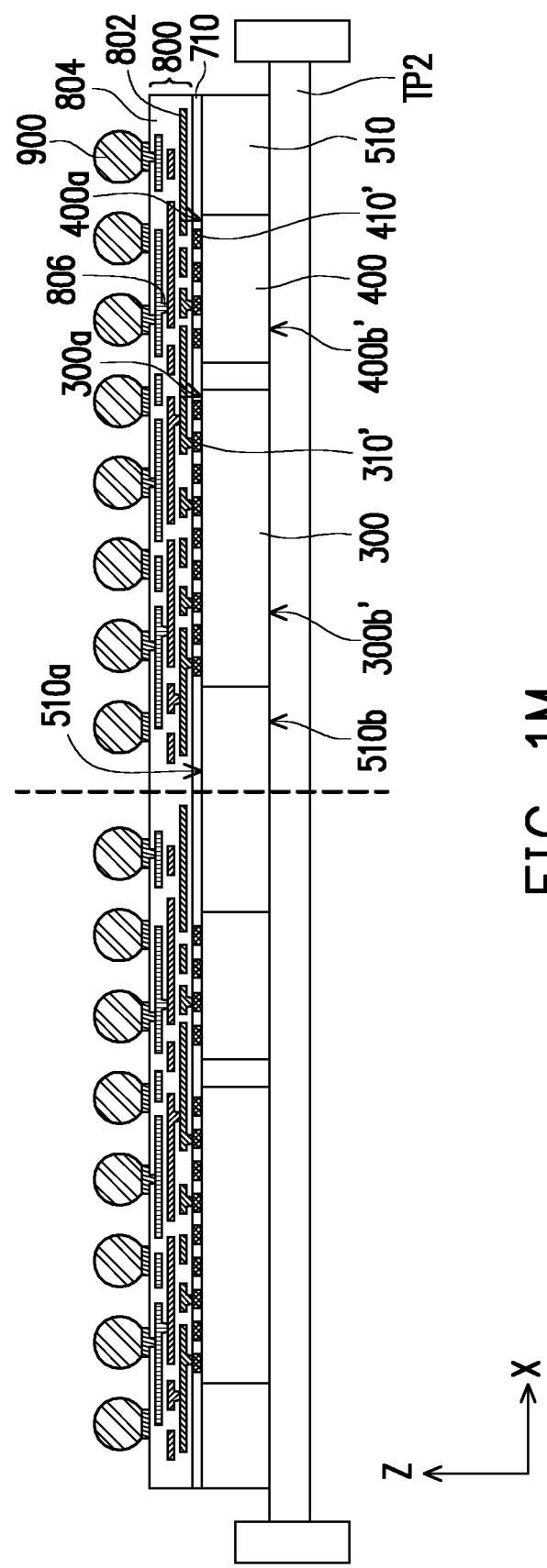
Figure 1N:
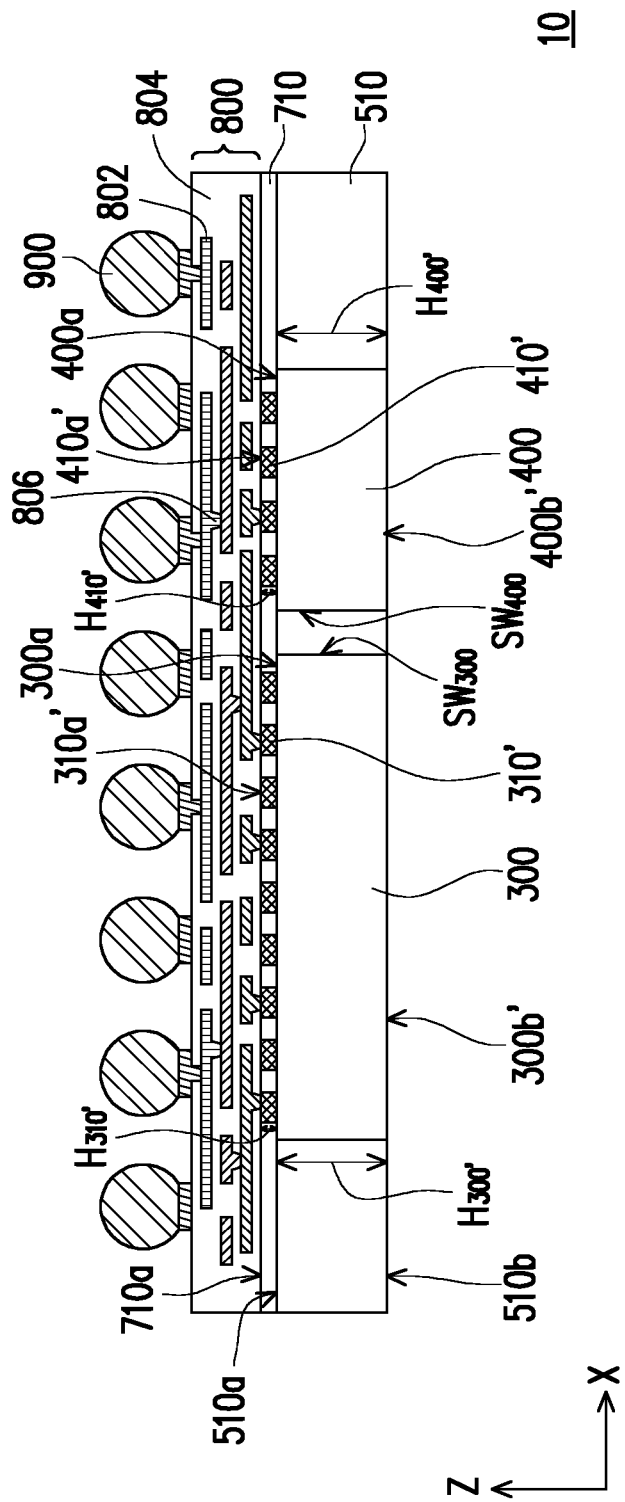

FIGS. 1A-1N are schematic cross-sectional views illustrating various stages of a method for manufacturing an integrated fan-out package 10 in accordance with some embodiments of the disclosure. Referring to FIG. 1A, a first carrier 100 is provided. A de-bonding layer 110 and an adhesive layer 200 are sequentially formed on the first carrier 100. In some embodiments, the first carrier 100 is a glass substrate. However, other material may be adapted as a material of the first carrier 100 as long as the material is able to withstand the subsequent processes while carrying the package structure formed thereon. In some embodiments, the de-bonding layer 110 is a light-to-heat conversion (LTHC) release layer formed on the glass substrate. The LTHC release layer may serve the purpose of de-bonding upon irradiation with for example, UV light. In some embodiments, the adhesive layer 200 includes an elastic polymeric material or a layer made of elastic polymeric material. The elastic polymeric material is, for example, phenol resin, epoxy resin, or acrylic polymer. In some embodiments, inorganic fillers such as silicon dioxide ($SiO_2$) may be added into the elastic polymeric material. In some embodiments, the adhesive layer 200 may serve the function of a thermal release film or an UV release film. The thermal release film may be peeled off when the film is heated to a specific temperature and the UV release film may be peeled off after UV exposure. In some embodiments, the adhesive layer 200 includes adhesion properties. In some embodiments, the adhesive layer 200 is able to accommodate conductive posts of dies formed thereon subsequently and is able to well seal the surfaces of the dies.

Referring to FIG. 1B, a plurality of first dies 300 and a plurality of second dies 400 are provided. Each first die 300 has an active surface 300a, a rear surface 300b opposite to the active surface 300a, and a plurality of conductive posts 310 formed on the active surface 300a. Each die 400 has an active surface 400a, a rear surface 400b opposite to the active surface 400a, and a plurality of conductive posts 410 formed on the active surface 400a. The conductive posts 310 of the first dies 300 and the conductive posts 410 of the second dies 400 may include copper posts, for example. In some embodiments, the first dies 300 may include the same types of chips and may be selected from application-specific integrated circuit ("ASIC") chips, analog chips, sensor chips, wireless and radio frequency chips, voltage regulator chips or memory chips. In some embodiments, the second dies 400 may include the same types of chips and may be selected from application-specific integrated circuit ("ASIC") chips, analog chips, sensor chips, wireless and radio frequency chips, voltage regulator chips or memory chips. In certain embodiments, the first dies 300 and the second dies 400 are different types of dies. For example, the first dies 300 and the second dies 400 may encompass different types of chips or different electronic components or elements. Depending on the application, the first dies 300 and the second dies 400 may perform different functions. In some embodiments, the first dies 300 may be system on chip (SoC) dies and the second dies 400 may be high bandwidth memory (HBM) dies. However, the disclosure is not limited thereto, and the first dies 300 and the second dies 400 may be other types of dies based on product needs. Since the first dies 300 and the second dies 400 are different types of dies, the sizes and heights of the first and second dies 300, 400 would be different. For example, as illustrated in FIG. 1B, a height of the first dies 300 (as denoted by the sum of height $H_{300}$ and height $H_{310}$) is different from a height of the second dies 400 (as denoted by the sum of height $H_{400}$ and height $H_{410}$). It should be noted that throughout the disclosure, a height of an element is referred to the distance between the active surface and the rear surface of the element in a thickness direction Z. In some embodiments, the height $H_{400}$ is different from the height $H_{300}$. Moreover, the height $H_{310}$ of the conductive posts 310 of the first dies 300 may also be different from the height $H_{410}$ of the conductive posts 410 of the second dies 400. It should be noted that since the height $H_{310}$ and the height $H_{410}$ of the conductive posts 310, 410 are small compared to the height $H_{300}$ and the height $H_{400}$ and may be negligible, for simplicity purposes in the disclosure, the height $H_{310}$ is referred to as the height of the first die 300 and the height $H_{410}$ is referred to as the height of the second die 400.

The first dies 300 and the second dies 400 are placed on the adhesive layer 200 such that the active surfaces 300a, 400a face the adhesive layer 200. The first dies 300 and the second dies 400 are pressed against the adhesive layer 200. It should be noted that before pressing, the active surfaces 300a of the first dies 300 and the active surfaces 400a of the second dies 400 are exposed. In other words, the first dies 300 and the second dies 400 are bare dies without a dielectric layer (for example, a polybenzooxazole (PBO) layer) formed on the active surfaces 300a, 400a thereof. As such, as the first dies 300 and the second dies 400 are pressed against the adhesive layer 200, the active surfaces 300a of the first dies 300 and the active surfaces 400a of the second dies 400 are in direct contact with a surface 200a of the adhesive layer. In some embodiments, a height $H_{200}$ of the adhesive layer 200 is at least equal to or larger than the height $H_{310}$ of the conductive posts 310 of the first dies 300 and the height $H_{410}$ of the conductive posts 410 of the second dies 400. As such, as the first dies 300 and the second dies 400 are pressed against the adhesive layer 200, the conductive posts 310 of the first dies 300 and the conductive posts 410 of the second dies 400 may be completely submerged into the adhesive layer 200. In other words, the conductive posts 310, 410 are encapsulated or well protected by the adhesive layer 200.

As illustrated in FIG. 1B, due to the height differences in the first dies 300 and the second dies 400, after the pressing process, the rear surfaces 400b of the second dies 400 are located at a level height higher than the rear surfaces 300b of the first dies 300. It should be noted that two first dies 300 and two second dies 400 are respectively illustrated in FIG. 1B. However, in some alternative embodiments, the number of the first dies 300 and the second dies 400 may vary based on need.

Referring to FIG. 1C, an encapsulation material 500 is formed over the adhesive layer 200. A first surface 500a of the encapsulation material 500 is in contact with the adhesive layer 200. In some embodiments, a height $H_{500}$ of the encapsulation material 500 is larger than the height $H_{310}$ of the first dies 300 and the height $H_{410}$ of the second dies 400. As such, the encapsulation material 500 completely encapsulates the first dies 300 and the second dies 400. In other words, a second surface 500b of the encapsulation material 500 is located at a level height higher than both of the rear surfaces 300b of the first dies 300 and the rear surfaces 400b of the second dies 400. The first dies 300 and the second dies 400 are not revealed and are well protected by the encapsulation material 500. In some embodiments, the encapsulation material 500 may be a molding compound formed by a molding processes. However, in some alternative embodiments, the encapsulation material 500 may be formed by an insulating material such as epoxy or other suitable resins. Meanwhile, the encapsulation material 500 may be formed through other processes corresponding to the insulating material selected.

Referring to FIG. 1D, a thinning process is performed to reduce the height $H_{500}$ of the encapsulation material 500, the height $H_{300}$ of the first dies 300, and the height $H_{400}$ of the second dies 400. In some embodiments, part of the encapsulation material 500 is removed to form an encapsulant 510 and to expose all of the first dies 300 and the second dies 400. In some embodiments, the thinning process includes a mechanical grinding process, a chemical mechanical polishing (CMP) process, or a combination thereof. In some embodiments, the height $H_{500}$ of the encapsulation material 500, the height $H_{300}$ of the first dies 300, and the height $H_{400}$ of the second dies are reduced through grinding. In some embodiments, as mentioned above, the height $H_{300}$ of the first dies 300 is different from the height $H_{400}$ of the second dies 400. When the encapsulation material 500 is partially removed to expose one of the rear surfaces 300b, 400b, another one of the rear surfaces 300b, 400b is still covered by the encapsulation material 500. Therefore, at least one of the rear surfaces 300b, 400b is further removed until another rear surface 300b, 400b is exposed. In some alternative embodiments, after both of the rear surfaces 300b, 400b are exposed, the grinding process may be continued on the first dies 300, the second dies 400, and the encapsulation material 500 to further reduce the overall thickness of the package formed later on.

As illustrate in FIG. 1D, the first surface 510a of the encapsulant 510 is leveled with the active surfaces 300a of the first dies 300 and the active surfaces 400a of the second dies 400. The second surface 510b of the encapsulant 510 is leveled with the rear surfaces 300b of the first dies 300 and the rear surfaces 400b of the second dies 400. Sidewalls $SW_{300}$ of the first dies 300 and sidewalls $SW_{400}$ of the second dies 400 are encapsulated by the encapsulant 510. In some embodiments, a height $H_{510}$ of the encapsulant 510 is substantially equal to a height $H_{300'}$ of the thinned first dies 300 and a height $H_{400'}$ of the thinned second dies 400.

Referring to FIG. 1E, a second carrier 600 having a de-bonding layer 610 and a die attach film (DAF) 620 sequentially formed thereon is provided. In some embodiments, the second carrier 600 may be similar to the first carrier 100 and the de-bonding layer 610 may be similar to the de-bonding layer 110, so the detailed description thereof is omitted herein. The rear surfaces 300b' of the first dies 300 and the rear surfaces 400b' of the second dies 400 are attached to the DAF 620.

Referring to FIG. 1E-1G, the first carrier 100 and the de-bonding layer 110 are separated from the adhesive layer 200 and then removed. In some embodiments, the de-bonding layer 110 (e.g., the LTHC release layer) may be irradiated by an UV laser such that the adhesive layer 200 is allowed to be peeled off from the first carrier 100. After the adhesive layer 200 is separated from the first carrier 100, the structure is flipped upside down to render the structure illustrated in FIG. 1F.

Referring to FIG. 1G, the adhesive layer 200 is removed from the first dies 300, the second dies 400, and the encapsulant 510 such that the first surface 510a of the encapsulant 510, the active surfaces 300a of the first dies 300, and the active surfaces 400a of the second dies 400 are exposed. In some embodiments, the adhesive layer 200 may be removed through a peel off process, a solvent wash off process, or an etching process.

Referring to FIG. 1H, a base material layer 700 is formed on the first surface 510a of the encapsulant 510, the active surfaces 300a of the first dies 300, and the active surfaces 400a of the second dies 400. The base material layer 700 has a first surface 700a and a second surface 700b opposite to the first surface 700a. In some embodiments, the base material layer 700 is formed directly on the encapsulant 510 covering the conductive posts 310, 410 of the first and second dies 300, 400 such that the second surface 700b of the base material layer 700 is in contact with the first surface 510a of the encapsulant 510. The base material layer 700 has a height $H_{700}$ larger than the height $H_{310}$ of the conductive posts 310 of the first dies 300 and the height $H_{410}$ of the conductive posts 410 of the second dies 400. In other words, both of the conductive posts 310, 410 are encapsulated by the base material layer 700. That is, both of the conductive posts 310, 410 are wrapped by a same material. In some embodiments, the base material layer 700 is made of dielectric material. The dielectric material includes, for example, polyimide, epoxy resin, acrylic resin, phenol resin, benzocyclobutene (BCB), polybenzooxazole (PBO), or any other suitable polymer-based dielectric material. In some embodiments, the base material layer 700 may include fillers with a size smaller than a filler of conventional molding compound or encapsulant. In some alternative embodiments, the base material layer 700 may be free of fillers. The base material layer 700 may be formed through, for example, a coating process or a lamination process. In some embodiments, the base material layer 700 may be cured after coating.

Referring to FIG. 1I, the height $H_{700}$ of the base material layer 700, the height $H_{310}$ of the conductive posts 310 of the first dies 300, and the height $H_{410}$ of the conductive posts 410 of the second dies 400 are reduced to form a base layer 710 and a plurality of conductive posts 310', 410'. Parts of the base material layer 700 and the conductive posts 310, 410 may be removed through a fly cutting process or a CMP process. As illustrated in FIG. 1I, top surfaces 310a' of the conductive posts 310' and top surfaces 410b' of the conductive posts 410' are exposed by the base layer 710. In some embodiments, a first surface 710a of the base layer 710, the top surfaces 310a' of the conductive posts 310', and top surfaces 410b' of the conductive posts 410' are leveled with each other. As such, a height $H_{710}$ of the base layer 710, a height $H_{310'}$ of the conductive posts 310, and a height $H_{410'}$ of the conductive posts 410 are substantially the same. In some embodiments, the heights $H_{310}$, $H_{410}$ of the conductive posts 310, 410 may be approximately 30 μm. After grinding, the reduced heights $H_{310'}$, $H_{410'}$ may be approximately 7 μm.

As mentioned above, the first surface 510a of the encapsulant 510 is leveled with the active surfaces 300a of the first dies 300 and the active surfaces 400a of the second dies 400, so the base material layer 700 is formed on a flat surface. Moreover, the conductive posts 310 of the first dies 300 and the conductive posts 410 of the second dies 400 are formed on a same level height. Therefore, when reducing the heights $H_{310}$, $H_{410}$ of the conductive posts 310, 410, the grinding process may be performed easily to obtain a desired height in the thickness direction Z with low under-grinding or over-grinding risk induced by height variation. Furthermore, as mentioned above, the base material layer 700 includes fillers with small size or no filler. As such, after grinding, the first surface 710a of the base layer 710 may be a smooth surface with little or no pits formed thereon.

Referring to FIG. 1J, a redistribution structure 800 is formed on the base layer 710, the conductive posts 310' of the first dies 300, and the conductive posts 410' of the second dies 400. Thereafter, a plurality of conductive terminals 900 are formed on the redistribution structure 800. In some embodiments, the redistribution structure 800 includes a plurality of redistribution conductive patterns 802 and a plurality of dielectric layers 804 stacked alternately. The redistribution conductive patterns 802 are interconnected with one another by conductive vias 806 embedded in the dielectric layers 804. The redistribution conductive patterns 802 are electrically connected to the conductive posts 310' of the first dies 300 and the conductive posts 410' of the second dies 400 such that the redistribution structure 800 is electrically connected to the first dies 300 and the second dies 400. In some embodiments, the material of the redistribution conductive patterns 802 includes aluminum, titanium, copper, nickel, tungsten, and/or alloys thereof. The redistribution conductive patterns 802 may be formed by, for example, electroplating, deposition, and/or photolithography and etching. In some embodiments, the material of the dielectric layers 804 includes polyimide, epoxy resin, acrylic resin, phenol resin, benzocyclobutene (BCB), polybenzooxazole (PBO), or any other suitable polymer-based dielectric material. The dielectric layer 804, for example, may be formed by suitable fabrication techniques such as spin-on coating, chemical vapor deposition (CVD), plasma-enhanced chemical vapor deposition (PECVD) or the like. In some embodiments, the material of the dielectric layers 804 in redistribution structure 800 is different from the material of the base layer 710. As mentioned above, the first surface 710a of the base layer 710 may be a smooth surface with little or no pits formed thereon. Therefore, in some embodiments, the redistribution structure 800 is formed on a smooth surface, which helps to ease the process complexity while ensuring the reliability of the redistribution structure 800.

In some embodiments, the topmost redistribution conductive patterns 802 are exposed from the topmost dielectric layer 804, and the exposed redistribution conductive patterns 802 includes under-ball metallurgy (UBM) patterns for ball mount. The conductive terminals 900 are formed on the UBM patterns. In some embodiments, the conductive terminals 900 are attached to the UBM patterns through a solder flux (not shown). In some embodiments, the conductive terminals 900 are, for example, solder balls, ball grid array (BGA) balls, or C4 bumps. In some embodiments, the conductive terminals 900 may be disposed on the UBM patterns by a ball placement process and/or a reflow process.

Referring to FIG. 1K and FIG. 1L, the structure illustrated in FIG. 1J is flipped upside down and is placed on a de-bonding carrier TP1. The de-bonding carrier TP1 may include a frame and a tape being held tightly by the frame.

The tape of the de-bonding carrier TP1 helps to provide support such that the second carrier 600 may be removed from the rear surface 300b' of the first dies 300, the rear surface 400b' of the second dies 400, and the second surface 510b of the encapsulant 510. In some embodiments, the de-bonding layer 610 (e.g., the LTHC release layer) may be irradiated by an UV laser such that the DAF 620 is allowed to be peeled off from the second carrier 600. The DAF 620 is further removed such that the rear surfaces 300b' of the first dies 300, the rear surfaces 400b' of the second dies 400, and the second surface 510b of the encapsulant 510 are exposed, as illustrated in FIG. 1L. In some embodiments, the DAF 620 may be removed through a peel off process, a solvent wash off process, or an etching process.

Referring to FIG. 1M and FIG. 1N, after the second carrier 600 is removed, the structure illustrated in FIG. 1L is separated from the de-bonding carrier TP1 and is flipped upside down again to attach to a dicing carrier TP2. Similar to the de-boding carrier TP1, the dicing carrier TP2 may also include a frame and a tape being held tightly by the frame. The tape of the dicing carrier TP2 helps to provide support such that the structure illustrated in FIG. 1M may be singulated to form the integrated fan-out package 10 illustrated in FIG. 1N. In some embodiments, a cutting mechanism used for the singulation process involves dicing with a rotating blade or a laser beam. In other words, the dicing or singulation process is, for example, a laser cutting process or a mechanical cutting process.

Figure 2A:
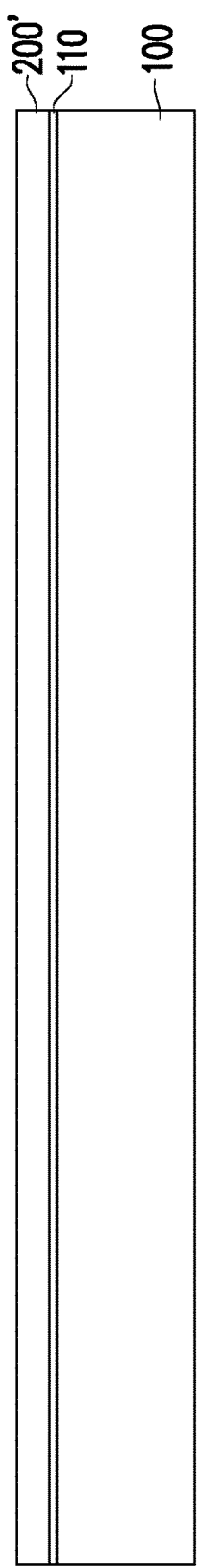
Figure 2B:
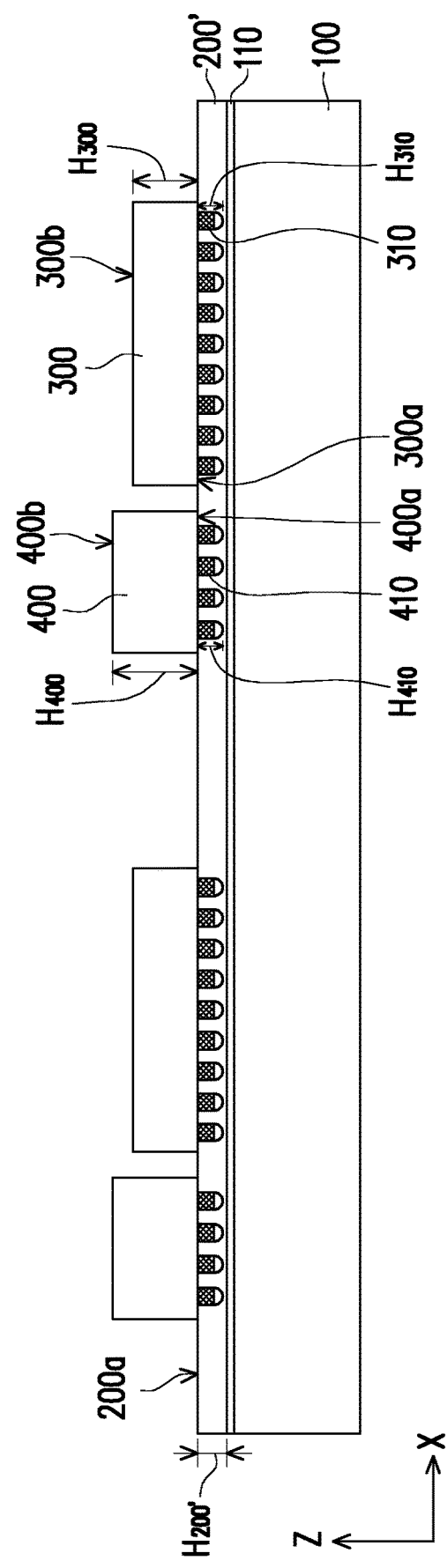

FIGS. 2A-2M are schematic cross-sectional views illustrating various stages of a method for manufacturing an integrated fan-out package 20 in accordance with some alternative embodiments of the disclosure. Various steps illustrated in FIGS. 2A-2M are similar to the steps illustrated in FIGS. 1A-1N, so similar elements are denoted by the same reference numeral. Referring to FIGS. 2A-2B, the process is similar to the process illustrated in FIGS. 1A-1B, so the detailed description thereof is omitted herein. It should be noted that in some embodiments, the adhesive layer 200' is formed of a thermosetting material. The thermosetting material is, for example, DAF (die attach film), FOD (film over die), FOW (film over wire), ABF (Ajinomoto Build-up Film), polyimide-based layers, or epoxy-based layers. In other words, the adhesive layer 200' may be cured when energy (for example, heat or light) is applied. In some embodiments, the adhesive layer 200' includes adhesion properties. In some embodiments, the adhesive layer 200' is able to accommodate conductive posts of dies formed thereon subsequently and is able to well seal the surfaces of the dies. In some embodiments, the adhesive layer 200' includes fillers with smaller size as compared to conventional encapsulant material or is free of fillers. Similar to the step illustrated in FIG. 1B, a height $H_{200'}$ of the adhesive layer 200' is equal to or larger than the height $H_{310}$ of the conductive posts 310 of the first dies 300 and the height $H_{410}$ of the conductive posts 410 of the second dies 400. As such, as the first dies 300 and the second dies 400 are pressed against the adhesive layer 200', the conductive posts 310 of the first dies 300 and the conductive posts 410 of the second dies 400 may be completely submerged into the adhesive layer 200'.

Figure 2C:
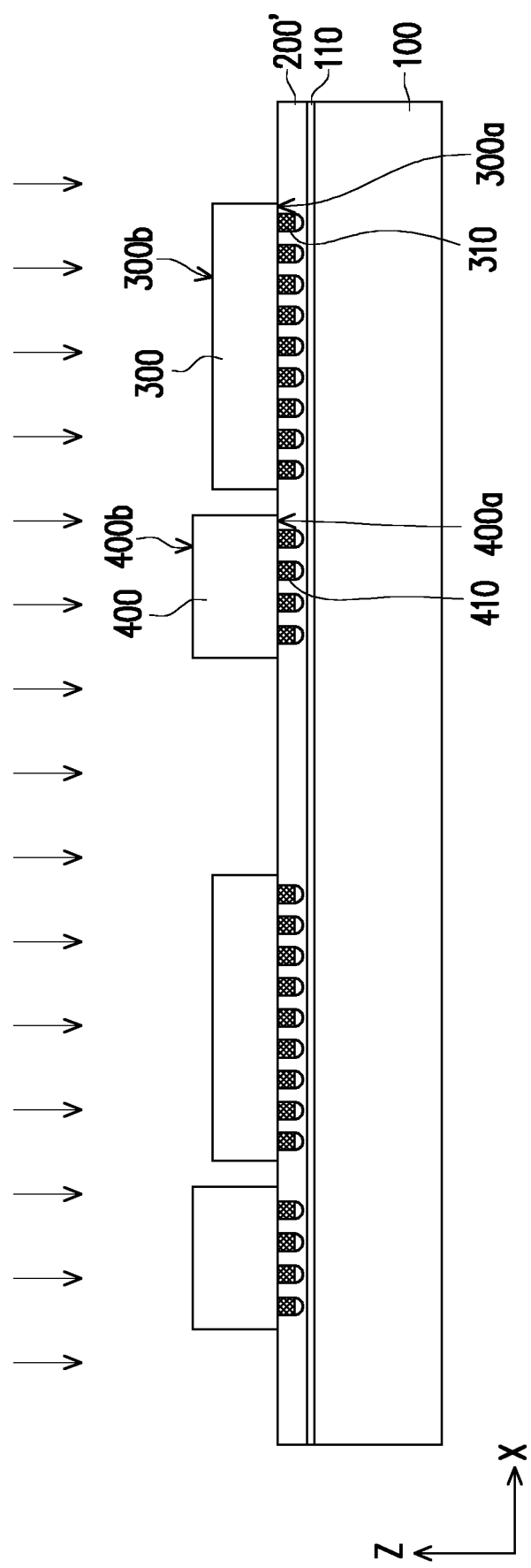
Figure 2F:
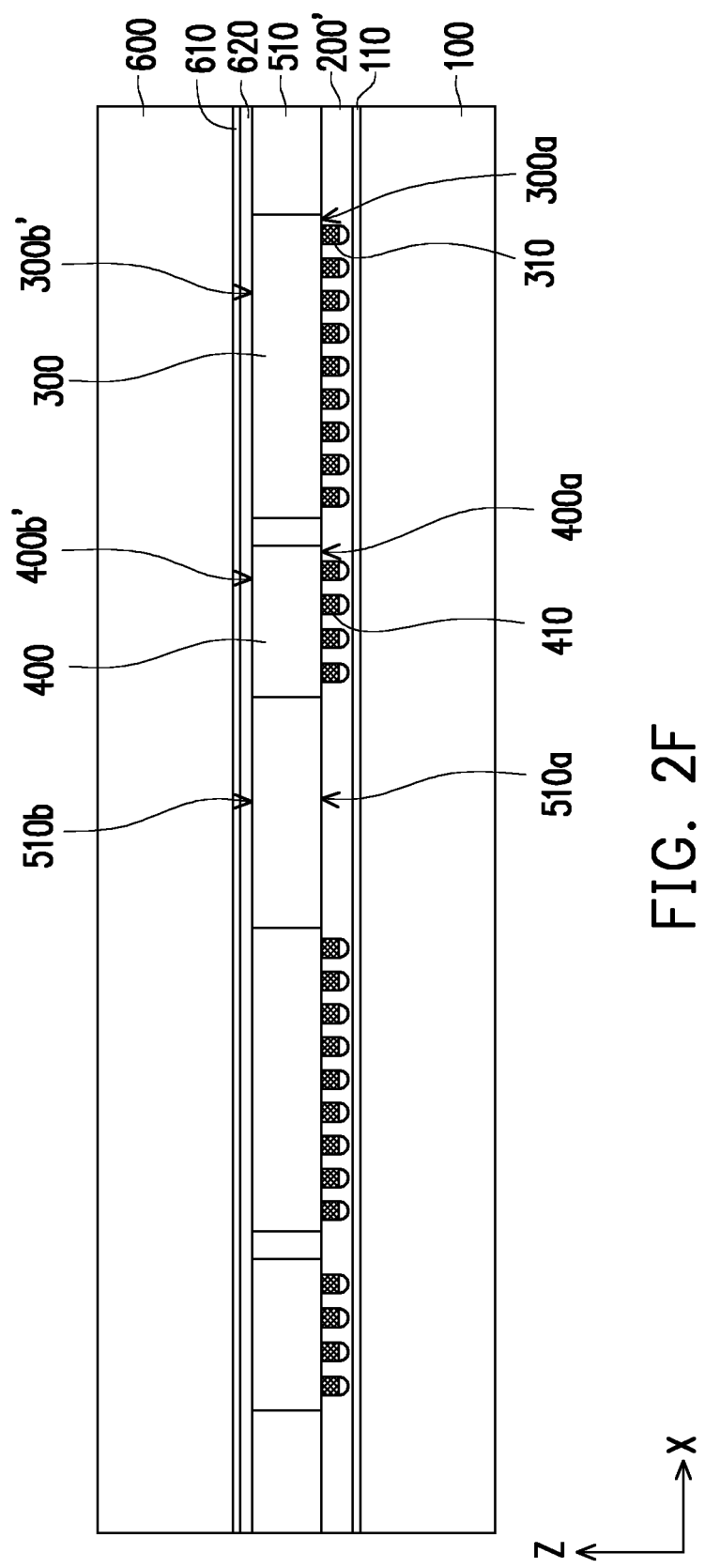

Referring to FIG. 2C, after the first dies 300 and the second dies 400 are pressed against the adhesive layer 200', the adhesive layer 200' is cured. As mentioned above, the adhesive layer 200' includes thermosetting material. Therefore, upon irradiation of light with certain wavelength or application of heat, the adhesive layer 200' maybe cured/hardened to encapsulate the conductive posts 310 of the first dies 300 and the conductive posts 410 of the second dies 400. In other words, both of the conductive posts 310, 410 are wrapped by a same material.

Referring to FIGS. 2D-2G, the process is similar to the process illustrated in FIGS. 1C-1F, so the detailed description thereof is omitted herein. Referring to FIGS. 2G-2H, the height $H_{200'}$ of the adhesive layer 200', the height $H_{310}$ of the conductive posts 310 of the first dies 300, and the height $H_{410}$ of the conductive posts 410 of the second dies 400 are reduced to form an adhesive layer 210 and a plurality of conductive posts 310', 410'. Parts of the adhesive layer 200' and the conductive posts 310, 410 may be removed through a fly cutting process or a CMP process. As illustrated in FIG. 2H, top surfaces 310a' of the conductive posts 310' and top surfaces 410b' of the conductive posts 410' are exposed by the adhesive layer 210. In some embodiments, a first surface 210a of the adhesive layer 210 is attached to the first surface 510a of the encapsulant 510, the active surfaces 300a of the first dies 300, and the active surfaces 400a of the second dies 400. On the other hand, a second surface 210b of the adhesive layer 210, the top surfaces 310a' of the conductive posts 310', and the top surfaces 410b' of the conductive posts 410' are leveled with each other. As such, a height $H_{210}$ of the adhesive layer 210, a height $H_{310'}$ of the conductive posts 310, and a height $H_{410'}$ of the conductive posts 410 are substantially the same. In some embodiments, the heights $H_{310}$, $H_{410}$ of the conductive posts 310, 410 may be approximately 30 μm. After grinding, the reduced heights $H_{310'}$, $H_{410'}$ may be approximately 7 μm.

As mentioned above, the conductive posts 310 of the first dies 300 and the conductive posts 410 of the second dies 400 are formed on a same level height. Therefore, when reducing the heights $H_{310}$, $H_{410}$ of the conductive posts 310, 410, the grinding process may be performed easily to obtain a desired height in the thickness direction Z with low under-grinding or over-grinding risk induced by height variation. As mentioned above, the adhesive layer 200' includes fillers with small size or no filler. As such, after grinding, the second surface 210b of the adhesive layer 210 may be a smooth surface with little or no pits formed thereon.

Figure 2I:
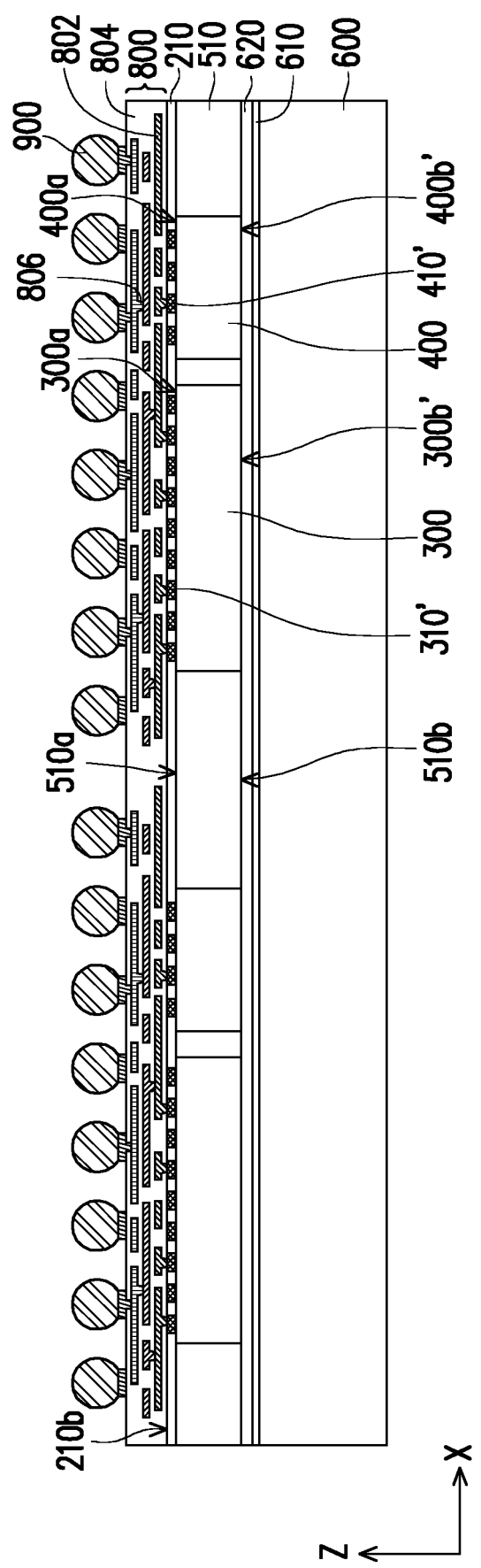
Figure 2J:
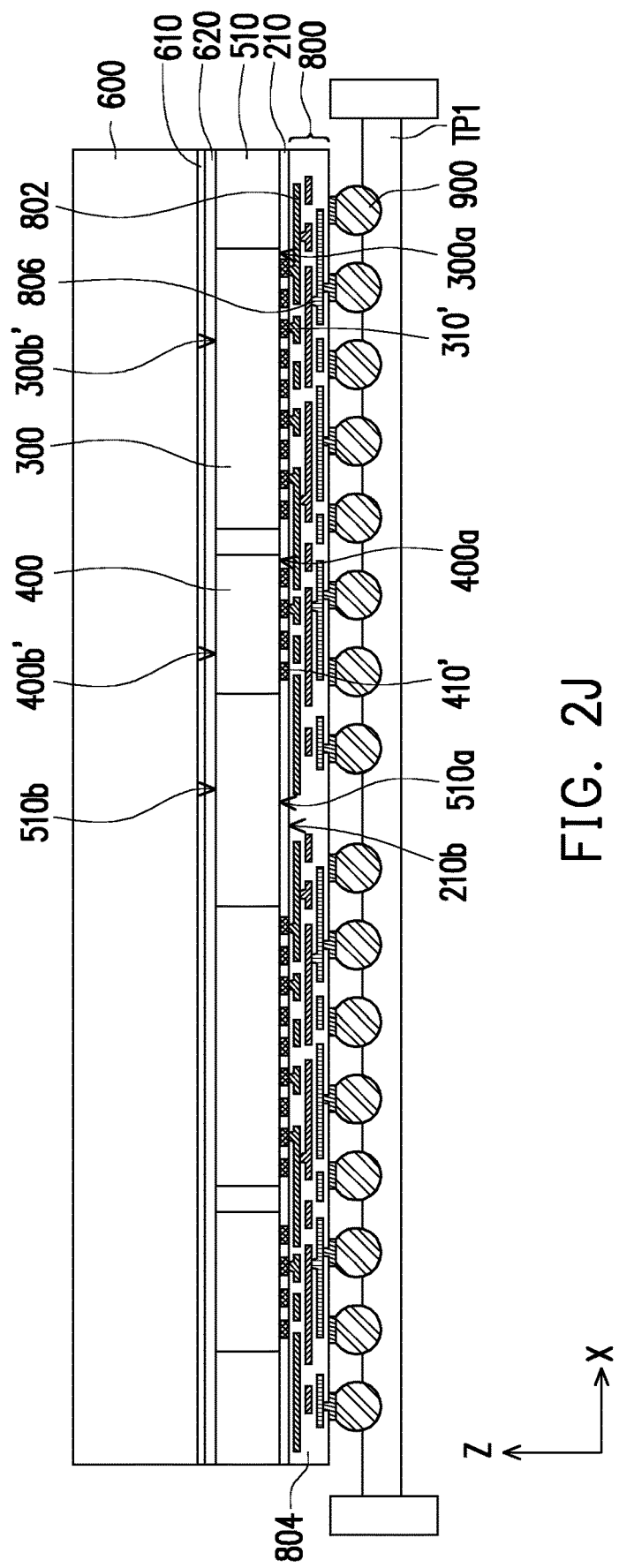
Figure 2K:
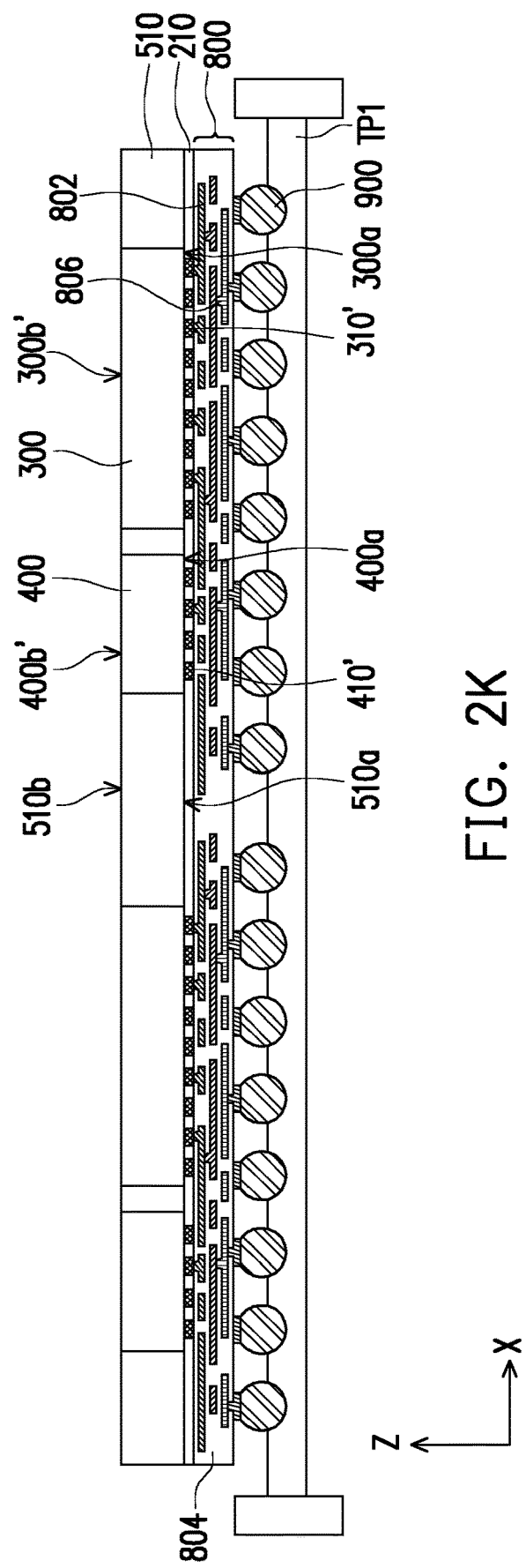
Figure 2L:
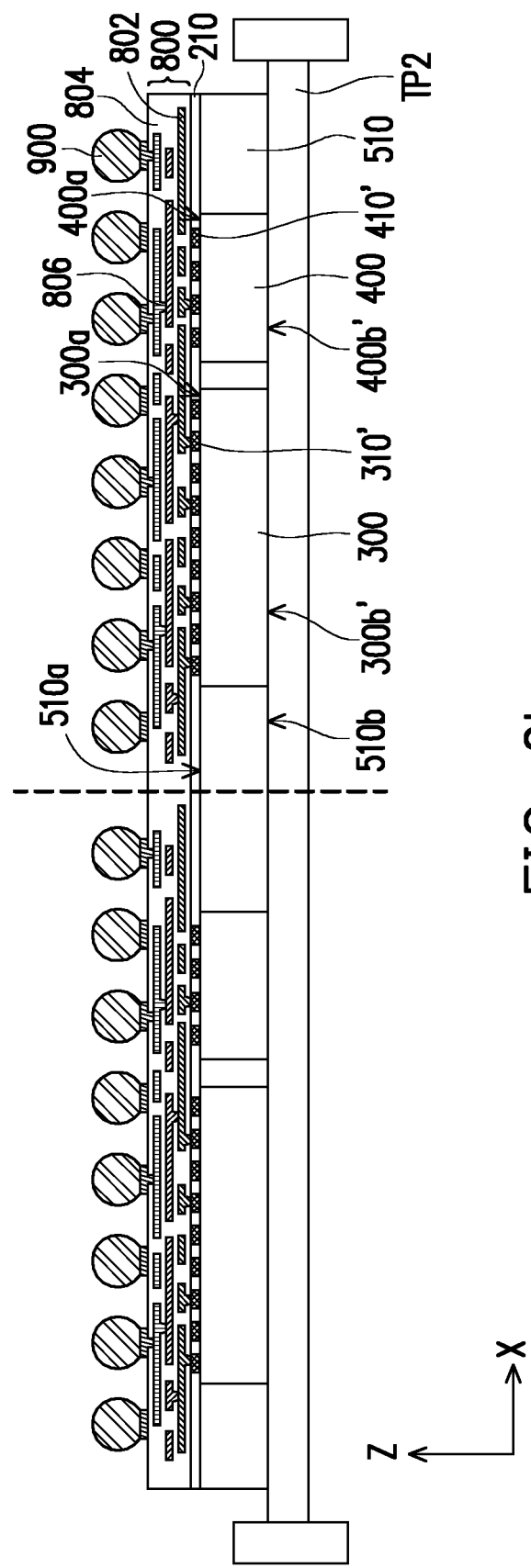
Figure 2M:
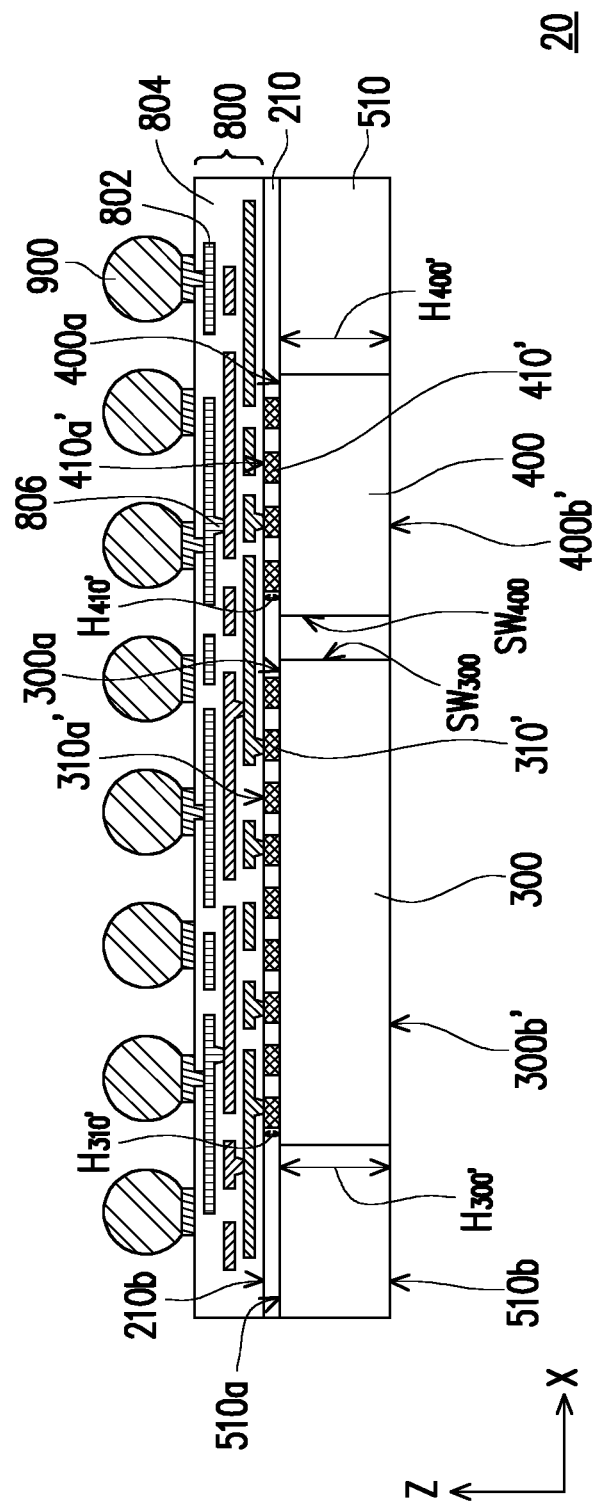

Referring to FIG. 2I, a redistribution structure 800 is formed on the adhesive layer 210, the conductive posts 310' of the first dies 300, and the conductive posts 410' of the second dies 400. Thereafter, a plurality of conductive terminals 900 are formed on the redistribution structure 800. The redistribution structure 800 and the conductive terminals 900 of FIG. 2I are similar to the redistribution structure 800 and the conductive terminals 900 of FIG. 1J, so the detailed descriptions thereof are omitted herein. In some embodiments, the material of the dielectric layers 804 in redistribution structure 800 is different from the material of the adhesive layer 210. As mentioned above, the second surface 210b of the adhesive layer 210 may be a smooth surface with little or no pits formed thereon. Therefore, in some embodiments, the redistribution structure 800 is formed on a smooth surface, which helps to ease the process complexity while ensuring the reliability of the redistribution structure 800.

Referring to FIGS. 2J-2M, the process is similar to the process illustrated in FIGS. 1K-1N to obtain the integrated fan-out package 20, so the detailed description thereof is omitted herein.

In accordance with some embodiments of the disclosure, an integrated fan-out package includes a first die, a second die, an encapsulant, and a redistribution structure. The first die and the second die respectively has an active surface, a rear surface opposite to the active surface, and a plurality of conductive posts formed on the active surface. The first die and the second die are different types of dies. The active surface of the first die is leveled with the active surface of the second die. The rear surface of the first die is leveled with the rear surface of the second die. A top surface of the conductive posts of the first die is leveled with a top surface of the conductive posts of the second die. The conductive posts of the first die and the conductive posts of the second die are wrapped by a layer of a same material. The encapsulant encapsulates sidewalls of the first die and sidewall of the second die. The encapsulant has a first surface and a second surface opposite to the first surface. The first surface is leveled with the active surfaces of the first die and the second die. The second surface is leveled with the rear surface of the first die and the second die. The redistribution structure is over the first die, the second die, and the encapsulant. The redistribution structure is electrically connected to the first die and the second die.

In accordance with some embodiments of the disclosure, a manufacturing method of an integrated fan-out package includes at least the following steps. A carrier having an adhesive layer formed thereon is provided. A first die and a second die are provided on the adhesive layer. A height of the first die is different from a height of the second die. The first die has first conductive posts and the second die has second conductive posts. The first conductive posts have substantially a same height and the second conductive posts have substantially a same height. The first die and a second die are pressed against the adhesive layer to make the active surfaces of the first die and the second die be in direct contact with the adhesive layer and the first and second conductive posts be submerged into the adhesive layer. The adhesive layer is cured. An encapsulant is formed to encapsulate the first die and the second die. The carried is removed from the adhesive layer. Heights of the first and second conductive posts are reduced and at least a portion of the adhesive layer is removed such that the first and second conductive posts are laterally wrapped by the adhesive layer and are exposed from the adhesive layer. Top surfaces of the first conductive posts are leveled with top surfaces of the second conductive posts. A redistribution structure is formed over the adhesive layer and the first and second conductive posts such that the redistribution structure is electrically connected to the first and second conductive posts.

In accordance with some alternative embodiments of the disclosure, a manufacturing method of an integrated fan-out package includes at least the following steps. A first carrier having an adhesive layer formed thereon is provided. A first die and a second die are pressed against the adhesive layer. The first die and the second die respectively has an active surface, a rear surface opposite to the active surface, and a plurality of conductive posts formed on the active surface. A height of the first die is different from a height of the second die. The active surfaces of the first die and the second die are pressed to be in direct contact with the adhesive layer. The conductive posts are pressed to be submerged into the adhesive layer. An encapsulant is formed to encapsulate the first die and the second die. The rear surfaces of the first die and the second die are attached to a second carrier. The first carrier is removed. The adhesive layer is removed from the first die, the second die, and the encapsulant. A base material layer is formed over the active surface of the first die and the second die to encapsulate the conductive posts. Heights of the base material layer and the conductive posts are reduced. A redistribution structure is formed over the conductive posts such that the redistribution structure is electrically connected to the conductive posts. The second carrier is removed from the rear surfaces of the first die and the second die.

In accordance with some alternative embodiments of the disclosure, a manufacturing method of an integrated fan-out package includes at least the following steps. A first carrier having an adhesive layer formed thereon is provided. A first die and a second die are pressed against the adhesive layer. The first die and the second die respectively has an active surface, a rear surface opposite to the active surface, and a plurality of conductive posts formed on the active surface. A height of the first die is different from a height of the second die. The active surfaces of the first die and the second die are pressed to be in direct contact with the adhesive layer. The conductive posts are submerged into the adhesive layer. The adhesive layer is cured to form a cured adhesive layer. An encapsulant is formed to encapsulate the first die and the second die. The rear surfaces of the first die and the second die is attached to the second carrier. The first carrier is removed from the cured adhesive layer. Height of the conductive posts and heights of the cured adhesive layer are reduced such that the conductive posts are laterally wrapped by the remaining cured adhesive layer. A redistribution structure is formed over the conductive posts such that the redistribution structure is electrically connected to the conductive posts. The second carrier is removed from the rear surfaces of the first die and the second die.

In accordance with some alternative embodiments of the disclosure, a manufacturing method of an integrated fan-out package includes at least the following steps. A carrier having an adhesive layer formed thereon is provided. A first die and a second die are pressed against the adhesive layer. The first die and the second die respectively has an active surface and a rear surface opposite to the active surface. The first die has first conductive posts disposed on the active surface of the first die and the second die has second conductive posts disposed on the active surface of the second die. A distance between a top surface of the first conductive posts and the rear surface of the first die is different from a distance between a top surface of the second conductive posts and the rear surface of the second die. The first die and the second die are pressed such that the active surfaces of the first die and the second die are coplanar with a surface of the adhesive layer. The adhesive layer is cured. An encapsulant is formed to encapsulate the first die and the second die. The carrier is removed from the adhesive layer. Heights of the first and second conductive posts are reduced and at least a portion of the adhesive layer is removed such that the first and second conductive posts are laterally wrapped by the adhesive layer. A redistribution structure is formed over the adhesive layer and the first and second conductive posts such that the redistribution structure is electrically connected to the first and second conductive posts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of an integrated fan-out package, comprising:
   providing a carrier having an adhesive layer formed thereon;
   providing a first die and a second die on the adhesive layer, wherein a height of the first die is different from a height of the second die, the first die has first conductive posts and the second die has second conductive posts, the first conductive posts have substantially a same height, and the second conductive posts have substantially a same height;
   pressing the first die and the second die against the adhesive layer to make the active surfaces of the first die and the second die be in direct contact with the adhesive layer and the first and second conductive posts be submerged into the adhesive layer;
   curing the adhesive layer;
   forming an encapsulation material over the adhesive layer to encapsulate the first die and the second die, wherein a height of the encapsulation material is larger than the height of the first die and the height of the second die;
   reducing the heights of the encapsulation material, the first die, and the second die to form an encapsulant encapsulating the first die and the second die, wherein a surface of the encapsulant is levelled with rear surfaces of the first die and the second die;
   removing the carrier from the adhesive layer;
   reducing heights of the first and second conductive posts and removing at least a portion of the adhesive layer such that the first and second conductive posts are laterally wrapped by the adhesive layer and are exposed from the adhesive layer, and top surfaces of the first conductive posts are levelled with top surfaces of the second conductive posts; and
   forming a redistribution structure over the adhesive layer and the first and second conductive posts such that the redistribution structure is electrically connected to the first and second conductive posts.

2. The method according to claim 1, further comprising performing a singulation process to singulate the integrated fan-out packages.

3. The method according to claim 1, further comprising forming a plurality of conductive terminals over the redistribution structure.

4. The method according to claim 1, wherein the adhesive layer is formed of a thermosetting material and the adhesive layer is cured before the encapsulant is formed.

5. The method according to claim 1, wherein in the step of pressing the first die and the second die against the adhesive layer, a height of the adhesive layer is larger than or equal to a height of the first conductive posts of the first die and a height of the second conductive posts of the second die.

6. The method according to claim 1, wherein reducing heights of first and second conductive posts and removing at least a portion of the adhesive layer comprises performing a fly cutting process or a chemical mechanical polishing process.

7. The method according to claim 1, wherein the first conductive posts have substantially a same height, and the second conductive posts have substantially a same height.

8. A manufacturing method of an integrated fan-out package, comprising:
   providing a first carrier having an adhesive layer formed thereon;
   pressing a first die and a second die against the adhesive layer, wherein the first die and the second die respectively has an active surface, a rear surface opposite to the active surface, and a plurality of conductive posts formed on the active surface, a height of the first die is different from a height of the second die, wherein the active surfaces of the first die and the second die are pressed to be in direct contact with the adhesive layer, and the plurality of conductive posts are submerged into the adhesive layer;
   curing the adhesive layer to form a cured adhesive layer;
   forming an encapsulation material over the cured adhesive layer to encapsulate the first die and the second die, wherein a height of the encapsulation material is larger than the height of the first die and the height of the second die;
   reducing the heights of the encapsulation material, the first die, and the second die to form an encapsulant encapsulating the first die and the second die, wherein a surface of the encapsulant is levelled with the rear surfaces of the first die and the second die;
   attaching the rear surfaces of the first die and the second die to a second carrier;
   removing the first carrier from the cured adhesive layer;
   reducing heights of the plurality of conductive posts and heights of the cured adhesive layer such that the plurality of conductive posts are laterally wrapped by the remaining cured adhesive layer;
   forming a redistribution structure over the plurality of conductive posts such that the redistribution structure is electrically connected to the plurality of conductive posts; and
   removing the second carrier from the rear surfaces of the first die and the second die.

9. The method according to claim 8, further comprising a singulation process to singulate the integrated fan-out packages.

10. The method according to claim 8, further comprising forming a plurality of conductive terminals over the redistribution structure.

11. The method according to claim 8, wherein the adhesive layer is formed of a thermosetting material.

12. The method according to claim 8, wherein a height of the adhesive layer is larger than or equal to a height of the plurality of conductive posts of the first die and a height of the plurality of conductive posts of the second die.

13. The method according to claim 8, wherein reducing heights of the plurality of conductive posts and heights of the cured adhesive layer comprises performing a fly cutting process or a chemical mechanical polishing process.

14. The method according to claim 8, wherein the plurality of conductive posts of the first die have substantially a same height, and the plurality of conductive posts of the second die have substantially a same height.

15. A manufacturing method of an integrated fan-out package, comprising:
   providing a carrier having an adhesive layer formed thereon;
   pressing a first die and a second die against the adhesive layer, wherein the first die and the second die respectively has an active surface and a rear surface opposite to the active surface, the first die has first conductive posts disposed on the active surface of the first die, the second die has second conductive posts disposed on the active surface of the second die, a distance between a top surface of the first conductive posts and the rear surface of the first die is different from a distance between a top surface of the second conductive posts and the rear surface of the second die, the first die and the second die are pressed such that the active surfaces of the first die and the second die are coplanar with a surface of the adhesive layer;

curing the adhesive layer;

forming an encapsulation material over the adhesive layer to encapsulate the first die and the second die, wherein a height of the encapsulation material is larger than the distance between the top surface of the first conductive posts and the rear surface of the first die and the distance between the top surface of the second conductive posts and the rear surface of the second die;

reducing the height of the encapsulation material, the distance between the top surface of the first conductive posts and the rear surface of the first die, and the distance between the top surface of the second conductive posts and the rear surface of the second die to form an encapsulant encapsulating the first die and the second die, wherein a surface of the encapsulant is levelled with the rear surfaces of the first die and the second die;

removing the carrier from the adhesive layer;

reducing heights of the first and second conductive posts and removing at least a portion of the adhesive layer such that the first and second conductive posts are laterally wrapped by the adhesive layer; and forming a redistribution structure over the adhesive layer and the first and second conductive posts such that the redistribution structure is electrically connected to the first and second conductive posts.

16. The method according to claim 15, further comprising performing a singulation process to singulate the integrated fan-out packages.

17. The method according to claim 15, further comprising forming a plurality of conductive terminals over the redistribution structure.

18. The method according to claim 15, wherein the adhesive layer is formed of a thermosetting material and the adhesive layer is cured before the encapsulant is formed.

19. The method according to claim 15, wherein in the step of pressing the first die and the second die against the adhesive layer, a height of the adhesive layer is larger than or equal to a height of the first conductive posts of the first die and a height of the second conductive posts of the second die.

20. The method according to claim 15, wherein reducing heights of first and second conductive posts and removing at least a portion of the adhesive layer comprises performing a fly cutting process or a chemical mechanical polishing process.

* * * * *